United States Patent [19]
Otto

[11] Patent Number: 5,250,328
[45] Date of Patent: Oct. 5, 1993

[54] PROCESS AND APPARATUS FOR PLASMA CVD COATING OR PLASMA TREATING SUBSTRATES

[75] Inventor: Jürgen Otto, Mainz, Fed. Rep. of Germany

[73] Assignee: Schott Glaswerke, Mainz, Fed. Rep. of Germany

[21] Appl. No.: 875,763

[22] Filed: Apr. 29, 1992

[30] Foreign Application Priority Data

Apr. 30, 1991 [DE] Fed. Rep. of Germany ....... 4114108

[51] Int. Cl.$^5$ ............................ B05D 3/06; B05D 3/02
[52] U.S. Cl. .................................... 427/535; 118/718; 118/724; 427/255.5; 427/314; 427/553; 427/573; 427/575; 427/595
[58] Field of Search ............... 427/535, 553, 573, 575, 427/595, 255.5, 314; 118/718, 724

[56] References Cited
FOREIGN PATENT DOCUMENTS 3147986 6/1983 Fed. Rep. of Germany .
3830249 3/1990 Fed. Rep. of Germany .
3926023 3/1990 Fed. Rep. of Germany .

*Primary Examiner*—Bernard Pianalto
*Attorney, Agent, or Firm*—Millen, White, Zelano & Branigan

[57] ABSTRACT

To provide large-surface substrates economically and in a short time, with coatings which are to be more impenetrable and more homogeneous than conventionally produced coatings, a plasma CVD process is employed in which a reaction gas capable of depositing a coating material therefrom flows over the surface to be coated and the reaction gas is excited into a band-shaped plasma by microwaves fed from two microwave feeds, in a device comprising end walls (2, 3) and a waveguide (1) with a square cross-section in which two standing waves polarized perpendicular to one another are excited and are shifted relative to one another by one-quarter wavelength, the coupling of the microwaves to the plasma being performed by a lengthwise slit (6) made in one of the edges of waveguide (1), with two crossed microwave polarizers (4, 5) being positioned in waveguide (1), such that each polarizer can be penetrated by the microwaves from the feed (7, 8) adjacent thereto and cannot be penetrated by the microwaves from the feed (7, 8) not proximate thereto, with the distance between an end wall (2, 3) and the polarizer (4, 5) proximate thereto being selected so as to form standing waves.

30 Claims, 7 Drawing Sheets

PROCESS AND APPARATUS FOR PLASMA CVD COATING OR PLASMA TREATING SUBSTRATES

BACKGROUND OF THE INVENTION

This invention relates to a process for coating substrates, in which a reaction gas capable of depositing a coating flows over the surface to be coated and the reaction gas is activated to a band-shaped plasma which is excited by microwaves generated in a waveguide. This invention also relates to a device in which the coating process of this invention and surface treatment of substrates with plasma can be performed.

To improve the coatability of a surface of various materials, plasmas generated by ultrahigh-, high-, or low-frequency discharges, as well as by direct current discharge, are often used. End use applications of this technique are cleaning or etching of surfaces, rendering plastic surfaces printable, e.g., by changing the wetting behavior thereof by liquids, and coating substrates with hard, scratch-resistant coatings or coatings that favorably change the optical and electrical properties of the substrate (interference coating systems, color coatings, electrically conducting coatings). For many uses, a high degree of uniformity in treating or coating with respect to various properties, such as coating thickness, porosity, refractive index, and conductivity, is essential. This generally presupposes the use of a plasma that acts uniformly over the entire surface.

From DE-OS 3 830 249 there is known a plasma (CVD) process for coating large-area, planar substrates in which the plasma electrodes are placed in an array above or below the surfaces to be coated, and the distance between two adjacent plasma electrodes is of a size such that their plasma columns overlap one another. The drawback of this arrangement is that the microwave energies emitted by the antennas do not become superimposed in the plasma into a completely uniform energy input. Furthermore, interference effects of the waves radiated by the antennas can appear that also disrupt uniformity.

From DE-PS 3 147 986 there is known a device for generating a microwave plasma for treating substrates in which a waveguide structure is used that is designated a "slow wave structure." This arrangement also leads to a non-homogeneous band plasma because of the decreasing energy input into the plasma along the waveguide structure.

From M. Geisler, J. Kieser, E. Raeuchle, R. Wilhelm, Journal of Vacuum Science and Technology A8, 908 (1990) "Elongated microwave electron cyclotron resonance heating plasma source," there is known a band-shaped arrangement (ECR) of permanent magnets and a microwave feed by elongated horn antennas to generate a band-shaped plasma.

While the relative movement of substrate and band-shaped plasma yields a good, homogenizing treatment and coating in the direction of movement, in all variants the homogeneity of the plasma in the direction of the band appears insufficient. Even with an offset arrangement of two such antennas, the one-dimensional grid of the slow wave structure does not lead to a completely uniform energy input into the plasma.

In addition to the same concerns as with the slow-wave structure, the inherent drawback of the ECR arrangement is the necessary low process pressure. If it is desired to achieve a high coating rate, which is generally the case, vacuum pumps with great pumping speed must be used to be able to pump out a large mass flow at a low process pressure. This represents an undesirably high equipment expense. Also, the requirements on the leak rate of load lock systems increase. Another drawback is in that long lead times are required to achieve the necessary operating pressure.

From DE-OS 3 926 023 there is known a CVD coating process for the production of coatings and a device for performing the process in which an antechamber in the form of a metallic tube with a slit-shaped opening is placed above the reaction space in which the substrate to be coated is positioned. In this antechamber, microwaves are generated that excite a plasma in the antechamber. The excitation of the reaction gas introduced into the reaction space is performed then by excited species that flow out of the plasma into the reaction space. Thus the plasma is located mostly in the antechamber and not in the reaction space. To coat a large-area substrate, the substrate is moved perpendicularly to a slit-shaped opening of the antechamber. The drawback of this process is that, because of the indirect excitation, only low coating and reaction rates can be achieved. This process is less well suited, e.g., for producing fully oxidized and impenetrable coatings of low porosity.

It is an object of this invention to provide a process and a device with which large-area substrates can be economically and, in particular, in a short time, be provided with coatings which are more impenetrable and more homogeneous than the coatings that can be achieved with CVD plasma coating processes according to the prior art.

Upon further study of the specification and appended claims, further objects and advantages of this invention will become apparent to those skilled in the art.

SUMMARY OF THE INVENTION

In a process aspect, this invention relates to a process for treating or coating a substrate in which a stream of a reaction gas capable when excited of depositing a substance therefrom onto the substrate flows over the surface to be coated and the reaction gas is excited to a band-shaped plasma excited by microwaves generated in a waveguide means, which comprises (a) exciting two standing waves which are polarized perpendicular to one another and shifting them relative to each other by one-quarter wavelength, in a waveguide means having a square cross-section; and (b) coupling the microwaves to the plasma by a lengthwise slit provided in one of the edges of the waveguide means.

In an apparatus aspect, this invention relates to a device for performing the process of this invention which comprises a reaction space for receiving a substrate a surface of which is to be treated or coated, provided with a gas inlet for feeding reaction gas thereinto and a waveguide adjacent to the reaction space in which waves of wavelengths $\lambda_{h1}$ and $\lambda_{h2}$, respectively, are excited, and which comprises (a) a waveguide with a first end closed by a first end wall and a second end closed by a second end wall;

(b) first and second microwave polarizers which are crossed and which are positioned in the waveguide at a distance $l_1 = \lambda_{h2}/2\ (n+\frac{1}{2})$; and (c) first and second microwave feeds for feeding the microwaves and positioned, respectively, between the first end wall and the first polarizer and between the second end wall and the second polarizer, so that each polarizer can be penetrated by the microwaves fed from the feed which is positioned adjacent thereto and cannot be penetrated by the microwaves fed from the feed which is positioned away therefrom; and wherein (i) the distance between each end wall and the polarizer positioned away therefrom in each case permits the formation of a stationary wave, and (ii) the waveguide has a square cross section and a lengthwise edge which, in the area between the polarizers, has a coupling slit therein of a length s and a width $b_1$ and which is closed relative to the reaction space and has a window therein formed of material through which the microwaves can penetrate.

DETAILED DESCRIPTION

It was discovered that the coating applied to a substrate by a plasma CVD process is far more homogeneous than conventionally applied plasma CVD coatings when, to generate a band-shaped plasma, in a waveguide two standing waves which are polarized perpendicular to one another are excited and are shifted relative to one another by one quarter wavelength and the coupling of the microwaves to the plasma is performed by a lengthwise slit (coupling slit) placed in one of the edges of the preferably square waveguide. The feeding of the microwaves is achieved in each case at the ends of the waveguide.

The use of two standing waves shifted relative to one another by one-quarter wavelength offers the advantage that the nodes of the one standing wave fall in the antinodes of the other stationary wave, so that the energy input into the plasma is rendered essentially uniform.

The use of two polarized waves whose polarization directions are perpendicular to one another has the advantage that the two waves do not influence each other and thus are independent of one another. For such waves polarized in linear fashion, identical conditions are to be found in the edge of the square waveguide so that it is advantageous to place the coupling slit in one of the edges of the waveguide.

It has turned out that, because of the microwave feed at both opposite ends of the waveguide, the power decrease of the one wave, which results from the coupling to the plasma in the direction of the plasma band, and thus also in the direction of the waveguide, is largely compensated for by the power increase, occurring in this direction, in the waves fed from the other side. Since the power decrease of both waves is described in each case by an exponential function dependent on attenuation, although it is true that, in the middle of the waveguide, an energy minimum is achieved, that minimum turns out to be far weaker than in the processes according to the prior art. This means that a far better homogeneity along the waveguide, and thus also a largely better homogeneity of the plasma acting on the substrate, are achieved.

Because the inner chamber of the waveguide is separated from the reaction space, in contrast to DE-OS 3 926 023, the plasma is moved completely into the reaction space, so that it is located directly above the substrate and a high coating and reaction rate is thus achieved. Furthermore, direct contact of the substrate with the plasma is advantageous, since the coatings are distinguished by a greater density and lower porosity.

The coupling slit in one of the edges of the waveguide interrupts wall currents j of the waveguide. These vary in the area of the edge in lengthwise direction X of the waveguide according to the equations $$j_1 = j_0^* \sin(a^* x),$$

$$j_2 = j_0^* \cos(a^* x), \text{ and}$$

$$a = 2\pi/\lambda_h,$$

in which $j_0$ designates the maximum wall current of the waveguide and $\lambda_h$ designates the wavelength in the waveguide when both standing waves have the same wavelength and, in the case of different standing waves, the wavelength averaged from both wavelengths. The attenuation here is assumed to be negligibly small.

In a first embodiment of the invention, two incoherent microwave emitters are used that generate two waves with different wavelengths $\lambda_{h1}$ and $\lambda_{h2}$ which preferably differ from one another by less than one percent. This provides the advantage that separate power $P_1$ and $P_2$ radiated by wall currents $j_1$ and $j_2$ additively are superimposed into total power P, which is then the same everywhere along the coupling slit, i.e., independent of coordinate x:

$$P = P_1 + P_2 = P_0^* \sin^2(ax) + P_0^* \cos^2(ax) = P_0$$

in which $P_0$ means the maximum power.

To improve the exchange of the reaction gas with fresh gas, in a preferred embodiment the microwave generators are operated periodically during a period $t_d$ and are shut off during a period $t_p$. Period $t_d$ preferably is between 0.5 and 2 ms and period $t_p$ between 1 and 100 ms.

According to a second embodiment of the invention, similar, coherent microwave generators are used that are alternately pulsed. Wavelengths $\lambda_{h1}$ and $\lambda_{h2}$ are equal in this embodiment. During period $t_d$, the microwave generators are alternately pulsed, and clock time $t_A$ of the pulse is small compared to the characteristic reaction, deposition and gas exchange times in the plasma. Clock times $t_A$ are preferably in the range of from 1 microsecond ($\mu$sec) to 100 microseconds ($\mu$sec). In this case, the average power, which alone is relevant for the coating or plasma treatment, becomes independent of coordinate x. A homogeneous plasma is excited in one dimension (x-direction) by the microwave fields radiated by the coupling slit.

As microwave frequencies, frequencies in the range 400 MHz to 10 GHz are used.

To be able to treat or coat large-area substrates, either the substrate is moved perpendicular to the coupling slit or the coupling slit is moved perpendicular relative to the substrate.

Depending on the material of the substrate and the coating to be applied to the substrate, it is advantageous to heat the substrate. For other material combinations it can, in turn, be advantageous to cool the substrate during the treatment or coating operation.

The device for performing the process comprises a reaction space for receiving the substrate to be treated or coated. A gas inlet for feeding the reaction gas ends in the reaction space. Adjacent to the reaction space there is a waveguide that comprises a rectangular, preferably square, cross-section. The waveguide is closed at both its ends by an end wall.

Two crossed microwave polarizers are placed in the waveguide at the distance $l_1 = \lambda_h/2(n+\frac{1}{2})$.

The feeds, which are the sources of the microwaves, are positioned between the respective end wall and the polarizer allocated to the end wall. Since an $H_{10}$ mode and an $H_{01}$ mode are preferably fed in, the feeds at the side walls of the waveguide are also arranged mutually offset by 90°.

The polarizer adjacent to the respective feed can be penetrated by the microwaves fed by this feed and the polarizer placed away from the respective feed cannot be penetrated by the microwaves fed in each case. In this way it is achieved that, for both fed waves, between the respective end wall and the more distant polarizer in each case, the waveguide forms a tuned cavity in which stationary waves form, when the distance of the respective end wall and the more distant polarizer in each case is a multiple of half the cavity wavelength $\lambda_{h1}$ or $\lambda_{h2}$.

So that both stationary waves are shifted relative to one another by $\lambda_h/4$, the distance between the end wall and the polarizer adjacent to the end wall is set at $\lambda_h/4$ or an uneven multiple of $\lambda_h/4$.

Between the two microwave polarizers, in a lengthwise edge of the waveguide, is provided a coupling slit of length s and width $b_1$ which is closed relative to the reaction space by a window which is formed of a material that can be penetrated by microwaves.

The complete spatial separation of waveguide and reaction space presents the advantage that the coating materials cannot be deposited at undesired places. The interior of the waveguide is under a pressure of preferably 1 bar to avoid igniting an undesired plasma in the waveguide.

To be able to use various wavelengths without having to use a specially adapted waveguide in each case, the polarizers and/or the end walls are arranged movably in the axial direction. The movability of the walls and/or polarizers allows adaptation of the waveguide to the wavelengths of the fed microwaves in each case.

The degree of coupling to the plasma can be varied according to a preferred embodiment by making the coupling slit in the shape of a coupling channel with a length d. This coupling channel is made by placing boundary walls extending essentially radially outward on the edge of the coupling slit. Length d is closely associated with respective wavelength $\lambda_h$ of the microwaves. When $d = \lambda_h/4$ is selected, the coupling is weak, with the result that also a weak attenuation along the waveguide appears. Weak attenuation means that the power decrease in the axial direction of the waveguide turns out to be small, so that along the coupling slit, a good homogeneity of the plasma can be achieved. When $d = 0$ is selected, which is synonymous with omission of the boundary walls, a strong coupling and thus also a strong attenuation is obtained. The homogeneity of the band plasma is thus degraded. Preferably as little attenuation as possible is sought, meaning that d is preferably set at $\lambda_h/4$. Although the coupling is weak, the power input into the plasma is comparable to strong coupling, because the Q factor of the cavity increases in this case. The microwaves travel several times back and forth in the waveguide, so that the power amount emitted by the microwaves is thus as large as that of a strongly coupled microwave which, for this purpose, but because of attenuation, passes through the waveguide only a few times.

The waveguide is placed on a metallic antenna base, and the coupling slit faces the antenna base. The antenna base consists essentially of a metal plate, in which a slit is provided whose width corresponds to the width of the coupling slit. The boundary walls of the coupling channel are conductively connected to the antenna base after the waveguide is positioned. This presents the advantage that the interrupted wall currents in the area of the coupling slit can propagate into the antenna base.

The microwave window that closes the coupling slit or the coupling channel is embedded in the antenna base and preferably lies on sealing elements, so that the interior of the waveguide is perfectly sealed relative to the reaction space. This is necessary because the pressure in the waveguide is preferably 1,000 mbar, while the pressure in the reaction space is about 1 mbar.

Width $b_2$ of the antenna base is preferably a multiple of width $b_1$ of the coupling slit. The selection of the width of the antenna base determines the extent of the plasma zone perpendicular to the lengthwise axis of the waveguide.

The gas inlet, through which all components of the reaction gas are introduced, is located on the side of the antenna base and preferably ends in front of the microwave window in the reaction space. The exit of the gas inlet is preferably adjusted to the width of the antenna base, so that the reaction gas is introduced precisely into the region in which the plasma is excited. The gas inlet extends essentially over the entire length of the coupling slit. On the opposite side of the gas inlet is the gas outlet, which also extends over almost the entire length of the coupling slit. Vacuum devices are attached to the gas outlet, so that fresh reaction gas can constantly be fed past the substrate and a continuous coating operation can be performed. Optionally, conventional cooling and/or heating means are provided to cool or heat the substrate during the treating or coating thereof.

To be able to coat large-area substrates, either the substrate is arranged to move, or the waveguide with antenna base and gas inlet and gas outlet devices are arranged to move. With the device, for example, tubes can also be coated on their inside, since the microwave device is so compact that it can be inserted completely into the tube interior. The coating is then performed so that either the pipe to be coated rotates or the pipe is held and the microwave device rotates. In both cases, the plasma is moved circumferentially along the inside surface of the pipe to be coated.

The device is also suited for coating slightly curved substrates. For this purpose, the waveguide is also curved in the axial direction. To coat two-dimensionally curved substrates, a waveguide which is curved in the axial direction is used and which is moved in a curved path that matches the curvature of the substrate.

Preferably a counterplate is placed on the side of the substrate facing away from the waveguide. The object of this counterplate is to spatially concentrate the microwave field used for excitation. Furthermore, the counterplate can be heatable, so that the coating can also be performed at raised temperatures.

To be able to perform either process variant, the feeds are connected to two microwave generators that feed microwaves of equal wavelength or microwaves of differing wavelengths. When identical microwave generators are used that generate microwaves of equal wavelength, the microwave generators are alternately pulsed during period $t_d$ by a suitable attachment, and clock time $t_A$ is in the range of one microsecond to 100 microseconds.

BRIEF DESCRIPTION OF THE DRAWINGS

Exemplary embodiments of the invention are explained in more detail below with reference to the drawings, in which.

DETAILED DESCRIPTION OF THE DRAWINGS

Figure 1:
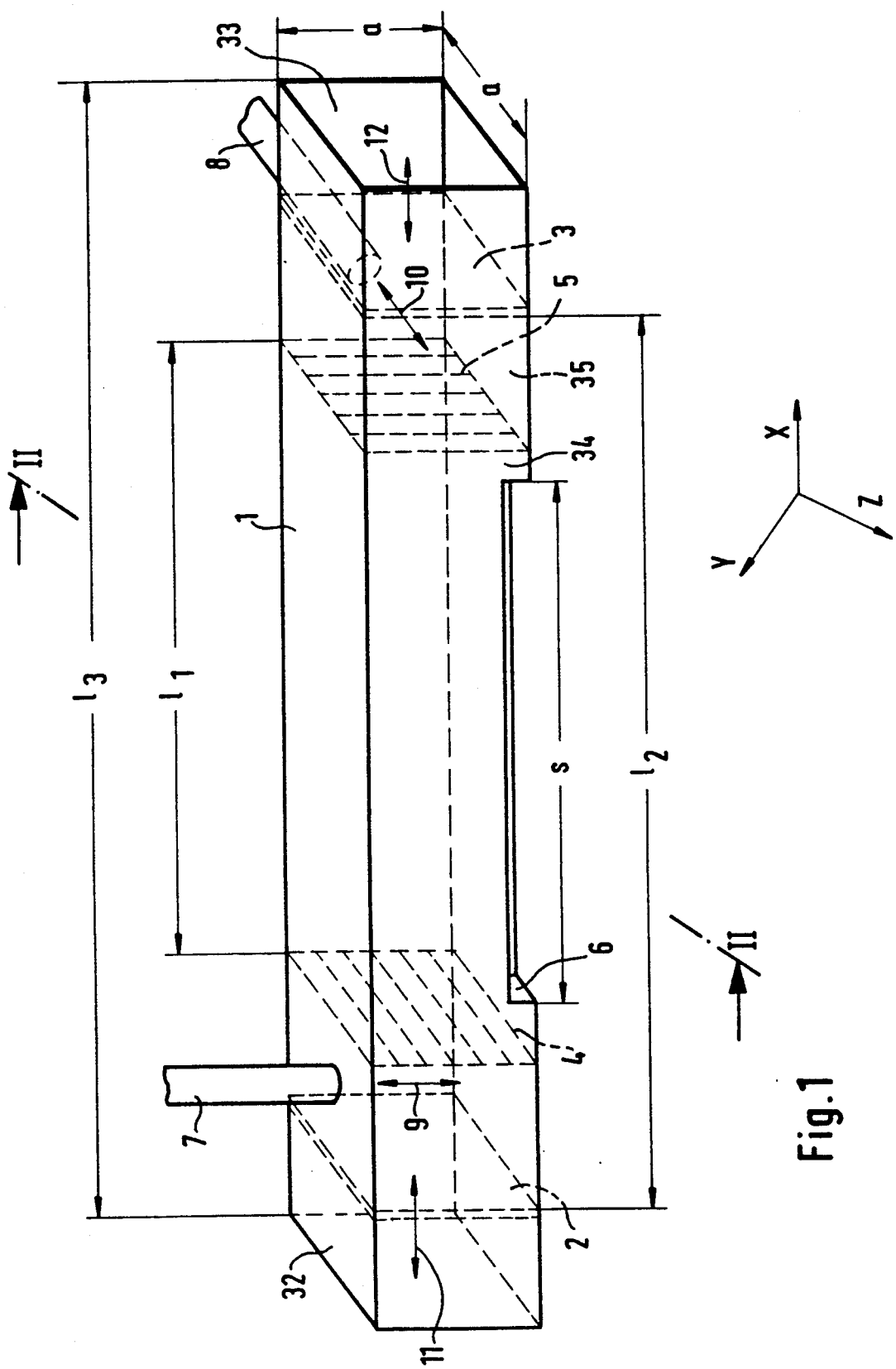
FIG. 1 is a perspective representation of a waveguide of a device of this invention.

In FIG. 1, a waveguide 1 is represented in perspective. The cross section of the embodiment of the waveguide shown in FIG. 1 is square with edge length a and the overall length of the waveguide is designated by $l_3$.

Microwave feeds 7 and 8, which are connected to microwave generators (not shown), are provided on the end sections of waveguide 1. In the embodiment shown, microwave feed 7 ends at side wall 32 of waveguide 1. $H_{10}$ modes are fed into waveguide 1 by microwave feed 7. Double arrow 9 indicates the E-field direction of the $H_{10}$ mode.

Feed 8 is connected to side wall 33 of waveguide 1. $H_{01}$ modes are fed into waveguide 1 by feed 8. Double arrow 10 indicates the E-field direction of the He modes.

Externally, the ends of the waveguide are closed by a first end wall 2 and by a second end wall 3. Both end walls 2 and 3 are arranged to move in the axial direction, as indicated by arrows 11 and 12.

Two microwave polarizers 4 and 5 are positioned in the interior of waveguide 1. First microwave polarizer 4 can be penetrated only by the vertically polarized microwaves fed by feed 7.

Second microwave polarizer 5 is placed adjacent to feed 8 and can be penetrated only by the horizontally polarized microwaves fed by feed 8. The distance of both microwave polarizers 4 and 5 is $l_1 = \lambda_h/2(n+\frac{1}{2})$, in which n is a whole number greater than 0.

Polarizer 4 cannot be penetrated by the $H_{01}$ modes that are fed by feed 8. Consequently, polarizer 5 cannot be penetrated by the $H_{10}$ modes fed by feed 7. The distance of first end wall 2 from second polarizer 5 is selected so that stationary waves for the $H_{10}$ modes form between end wall 2 and polarizer 5. Likewise, the distance between second end wall 3 and first polarizer 4 is selected so that stationary waves for the $H_{01}$ modes also form. To guarantee a shifting of both waves by $\lambda_h/4$, the distance between first end wall 2 and first polarizer 4 or second end wall 3 and second polarizer 5 is an uneven multiple of wavelength $\lambda_h/4$.

A coupling slit 6 of length s is provided between two polarizers 4 and 5 in the front edge of waveguide 1. Preferably, coupling slit 6 is somewhat shorter than the distance between microwave polarizers 4 and 5.

Figure 2:
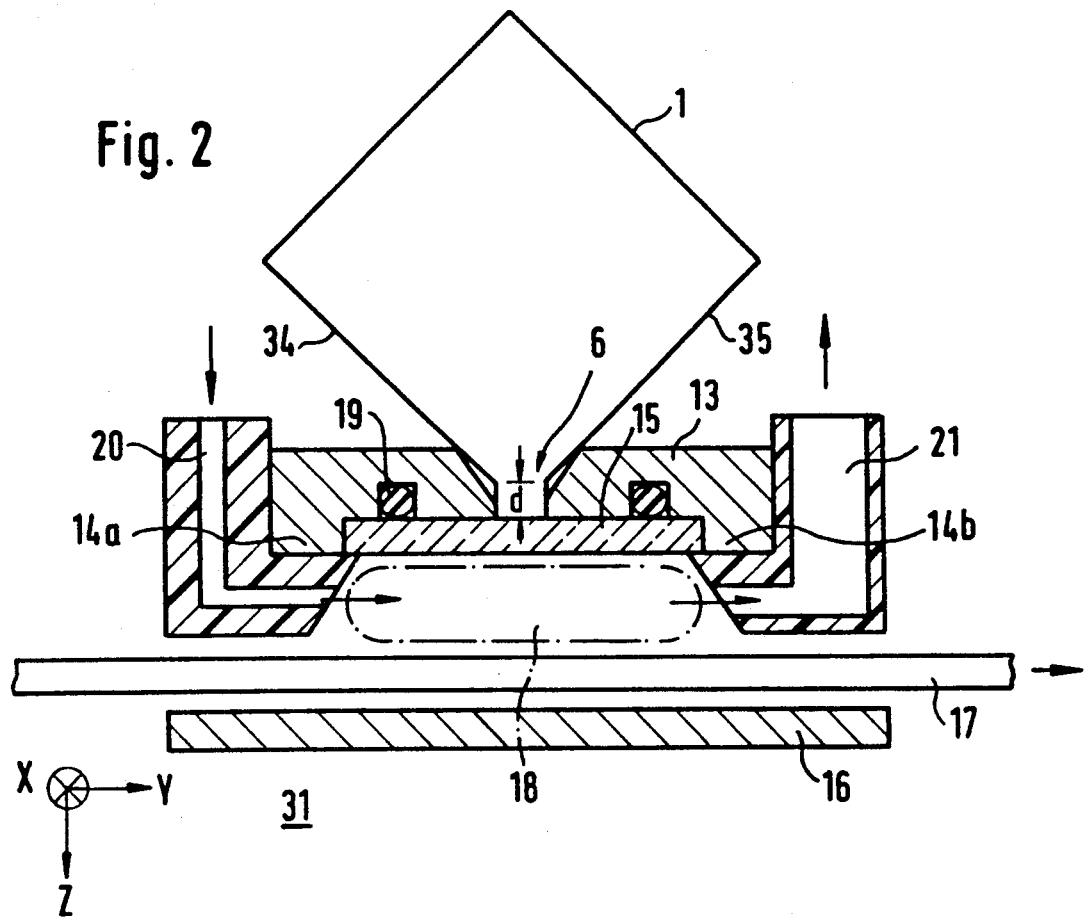
FIG. 2 is a section along line II—II through the waveguide shown in FIG. 1 with antenna base and reaction space.

FIG. 2 shows a cross-section of waveguide 1 along line II—II of the embodiment shown in FIG. 1, and of antenna base 13, on which waveguide 1 rests. Because coupling slit 6 is positioned in one of the edges of waveguide 1, the waveguide rests with its side walls 34 and 35 on antenna base 13, which consists of an electrically conductive material, preferably metal. Antenna base 13 has the shape of a plate, in the middle of which a lengthwise slit is provided whose width corresponds essentially to width $b_1$, as shown in FIG. 3.

Figure 3:
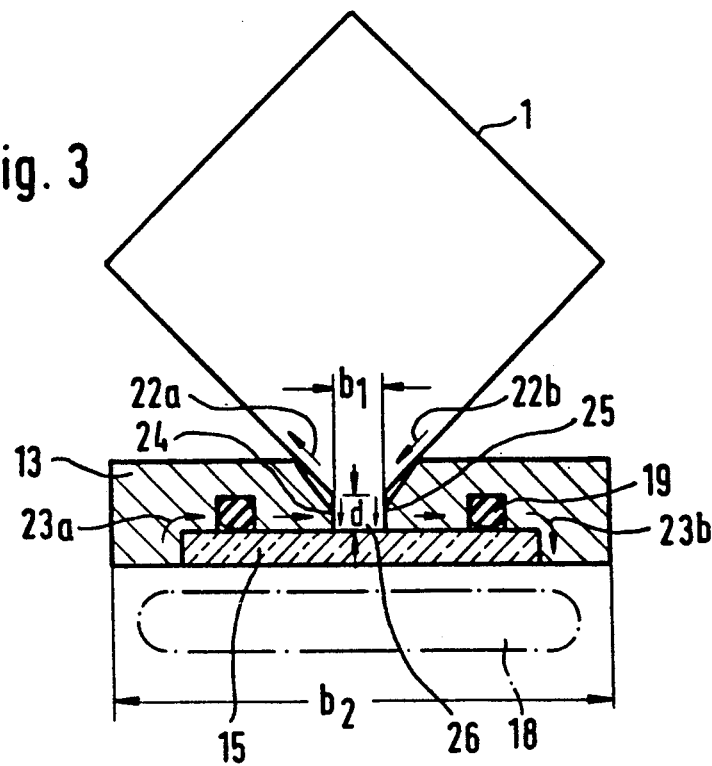
FIG. 3 is a detail representation of the cutaway drawing shown in FIG. 2.

As can be seen in FIGS. 2 and 3, outward-extending boundary walls 24 and 25 are made on waveguide 1 in the area of coupling slit 6, forming a coupling channel 26 of length d. Width $b_1$ of coupling slit 6 is selected so that, on the one hand, no overtopping occurs between boundary walls 24 and 25 and, on the other hand, the waves in the axial direction are not disturbed.

Coupling slit 6 or coupling channel 26 is closed, relative to reaction space 31 under it, by a microwave window 15. Since boundary walls 24, 25 are leakproof connected to antenna base 13, and the interior of waveguide 1 is also vacuum-tight sealed, relative to reaction space 31, microwave window 15 is supported on seals 19 that are placed in antenna base 13. Microwave window 15 is embedded in antenna base 13 so that side sections 14a and 14b of the antenna base overlap microwave window 15.

Plasma zone 18 is represented diagrammatically under microwave window 15. The reaction gas is fed into the plasma zone by gas inlet 20. Gas inlet 20 is positioned on the side of antenna base 13 and extends essentially over the same length as coupling slit 6. On the opposite side of the gas inlet, gas outlet 21 is positioned on the side on antenna base 13. Gas outlet 21 is also slit-shaped and extends over the entire length of coupling slit 6. The gas inlet ends in the position shown just in front of microwave window 15.

Substrate 17 is moved in the y-direction under coupling slit 6 so that plasma zone 18 is moved over the surface to be coated of substrate 17. Since plasma zone 18 is homogeneous in the x-direction, and substrate 17 is moved continuously in the y-direction, a coating that is homogeneous in both dimensions is applied to substrate 17.

Another counterplate 16 that is optionally made heatable is provided under substrate 17. Counterplate 16 is also electrically conductive.

In FIG. 3, the device shown in FIG. 2 is represented in detail. Arrows 22a and 22b designate the wall currents in waveguide 1, shown more clearly in FIG. 4. Wall currents 22a and 22b are propagated in metallic antenna base 13 because of the conductive connection with boundary walls 24 and 25 and form currents 23a and 23b. These currents lead around microwave window 15. Electric field lines exit side sections 14a and 14b and enter plasma zone 18.

Figure 4:
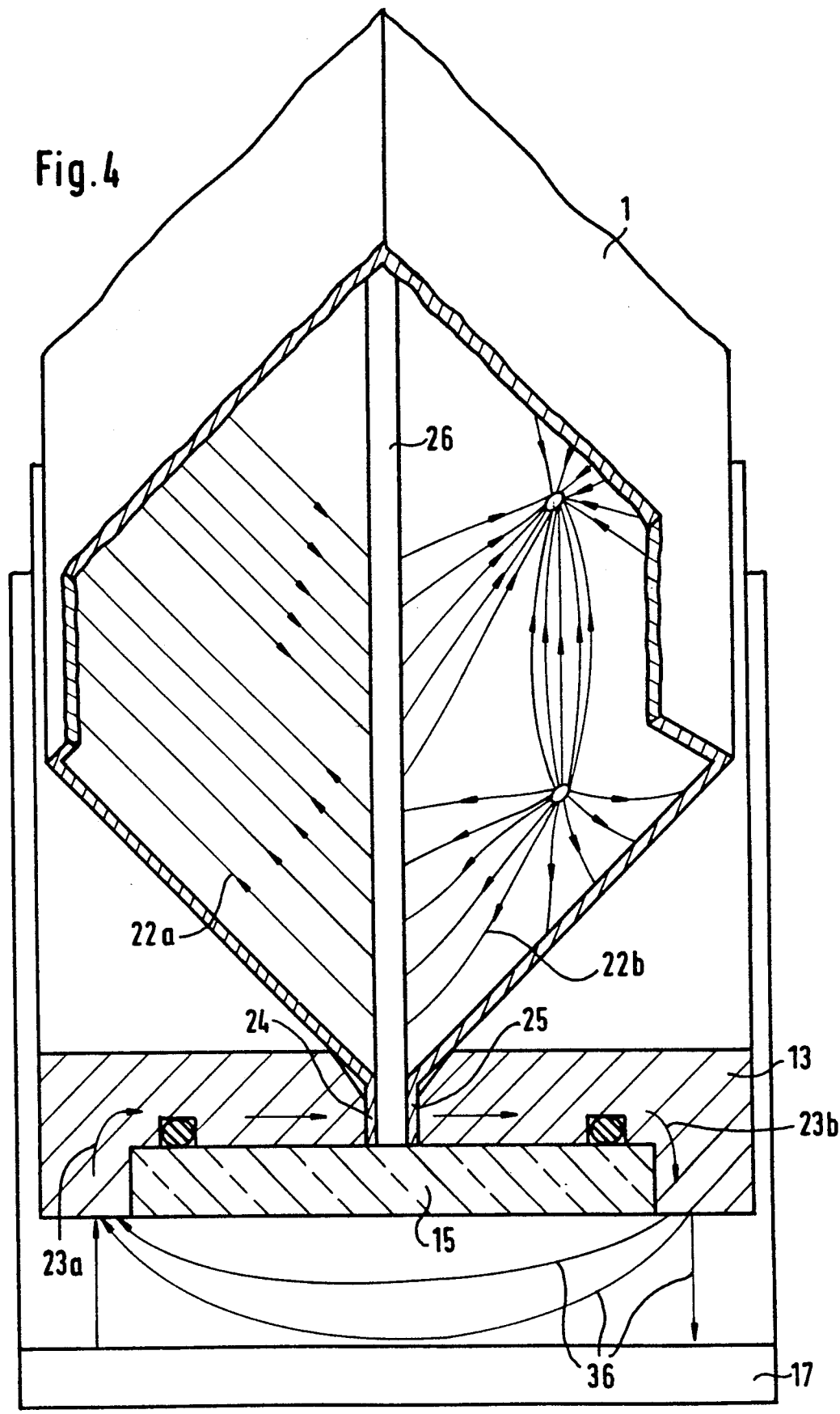
FIG. 4 is a perspective representation of the waveguide with antenna base to clarify the wall currents.

As can be seen in FIG. 4, by providing counterplate 16, the fed-in microwave field indicated by arrow 36 forms in plasma zone 18.

The width of plasma zone 18 is thus determined essentially by width $b_2$ of antenna base 13.

Figure 6:
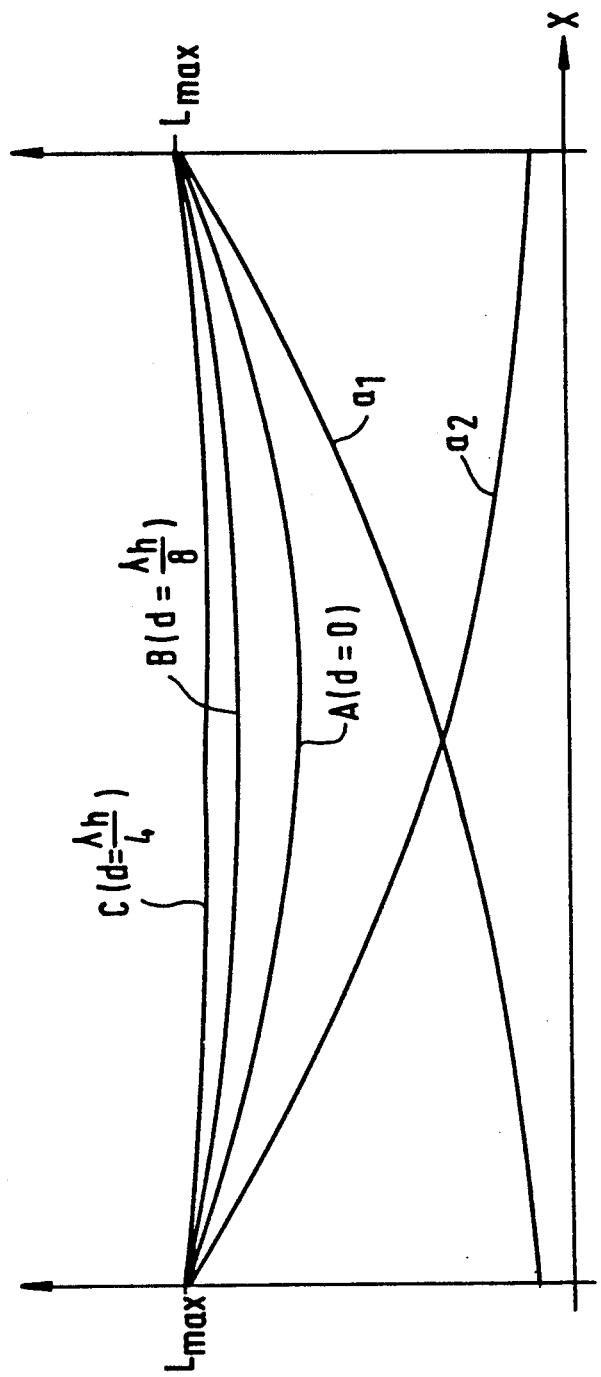
FIG. 6 is a graphic representation of the power input as a function of space coordinate X.

The length d of coupling channel 26 is selected so that, with good coupling to the plasma, homogeneity is achieved to a large extent in the axial direction. The power input along space coordinate X is represented in FIG. 6. Curve a2 describes the power input of the $H_{10}$ mode fed by microwave feed 7. Curve a1 illustrates the power input of the $H_{01}$ mode fed by microwave feed 8. Superposition of both curves a1 and a2 results in a catenary-like curve represented by curve A. The shape of curves A, B and C depends greatly on parameter d and, with increasing d, the drop in the energy input becomes smaller. For this reason, a value for d greater than 0 is selected which preferably is a value between $\lambda_h/8$ and $\lambda_h/4$.

Figure 5:
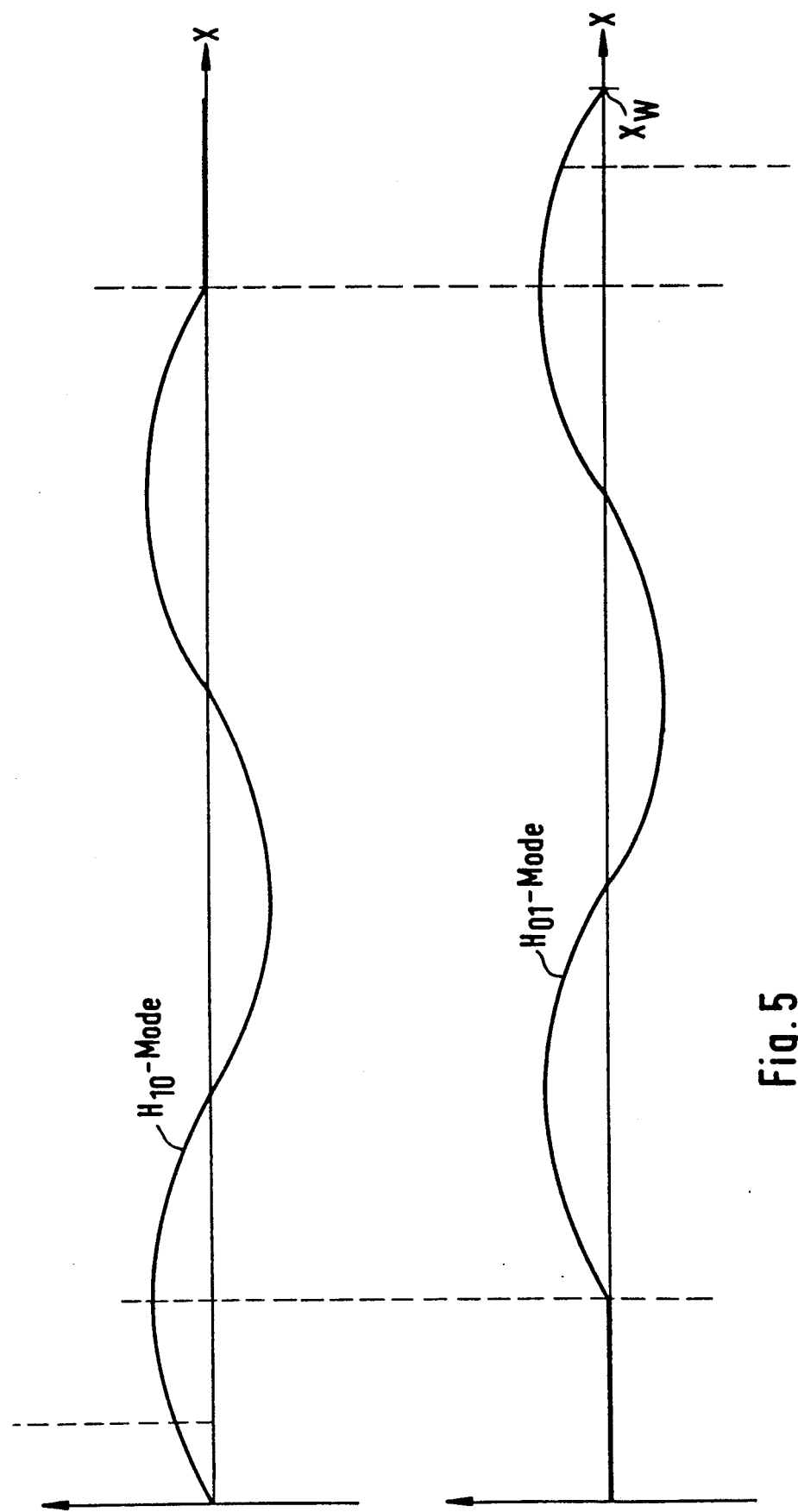
FIG. 5 is a graphic representation of the electrical field as a function of space coordinate X.

In FIG. 5, both stationary waves of the $H_{10}$ mode and of the $H_{01}$ mode are represented as a function of space coordinate X. In the top curve, end wall 2 is located at point X=0 and in the bottom curve, end wall 3 is located point $X_w$. The position of polarizers 4 and 5 is represented by dotted lines. It can be seen that, in the top representation, a standing wave is formed between wall 2 and polarizer 5 whereas, in the bottom representation, the standing wave is generated between polarizer 4 and wall 3. Both waves are shifted relative to one another by one-quarter wavelength.

Figure 7:
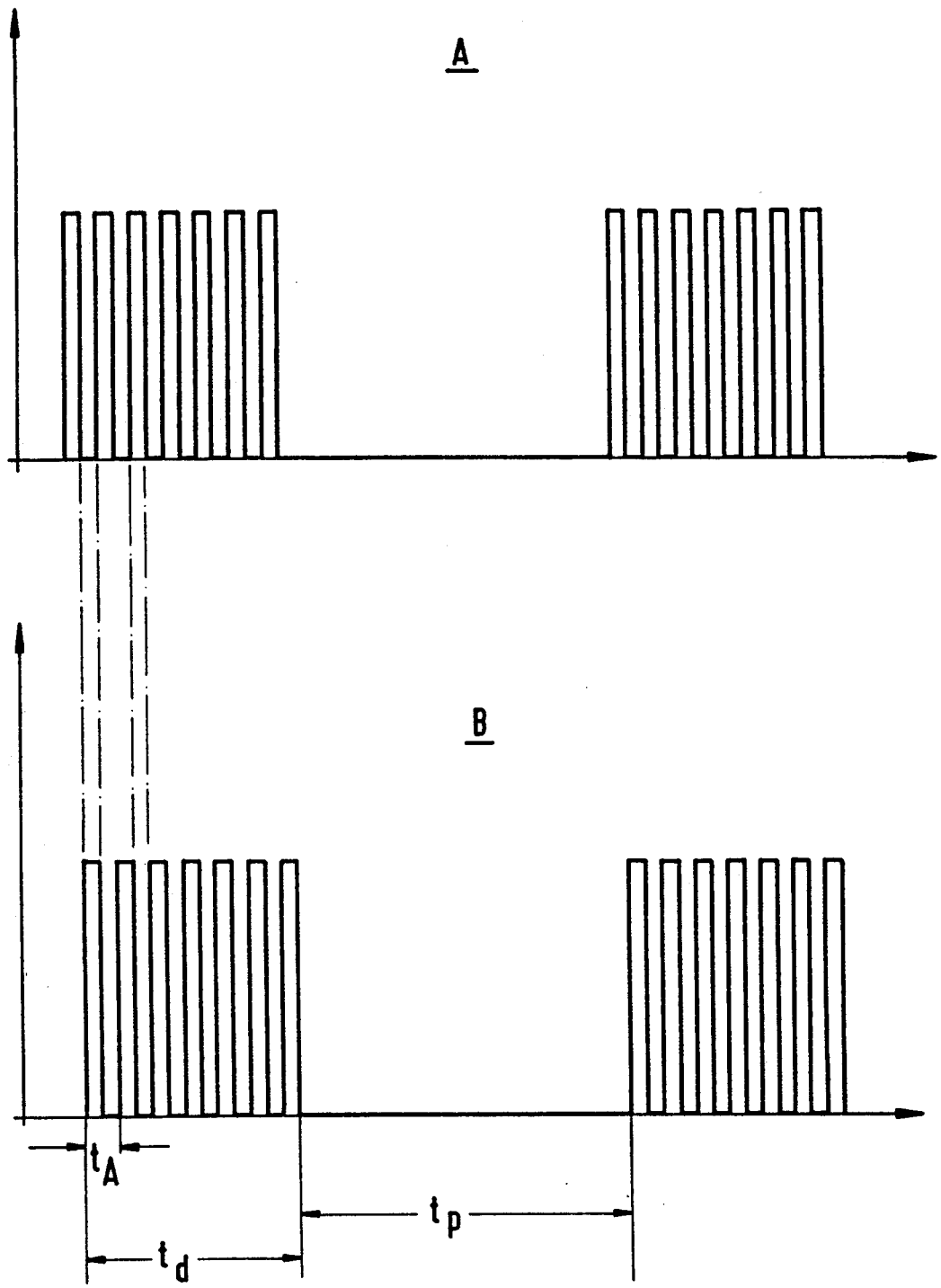
FIG. 7 is two graphic representations A and B of the power fed, pulsed, into the waveguide, as a function of time.

According to one embodiment, microwaves of equal wavelength can be fed by microwave feeds 7 and 8. In this embodiment, the microwaves are pulsed, specifically with a clock time $t_A$. The top representation shown in FIG. 7 shows power $P_1$ fed by microwave feed 7 and the curve shown in the bottom representation shows power $P_2$ fed by microwave feed 8. Clock times $t_A$ are equal in both cases, and the feeding in through microwave feed 8 is always performed when no feed is performed through feed 7, and vice versa. To improve the gas exchange in the reaction volume, the microwave generators are turned on periodically during period $t_d$ and are turned off during period $t_p$. During shut-off time $t_p$, fresh reaction gas can expel the gas already present in the reaction space.

Figure 8:
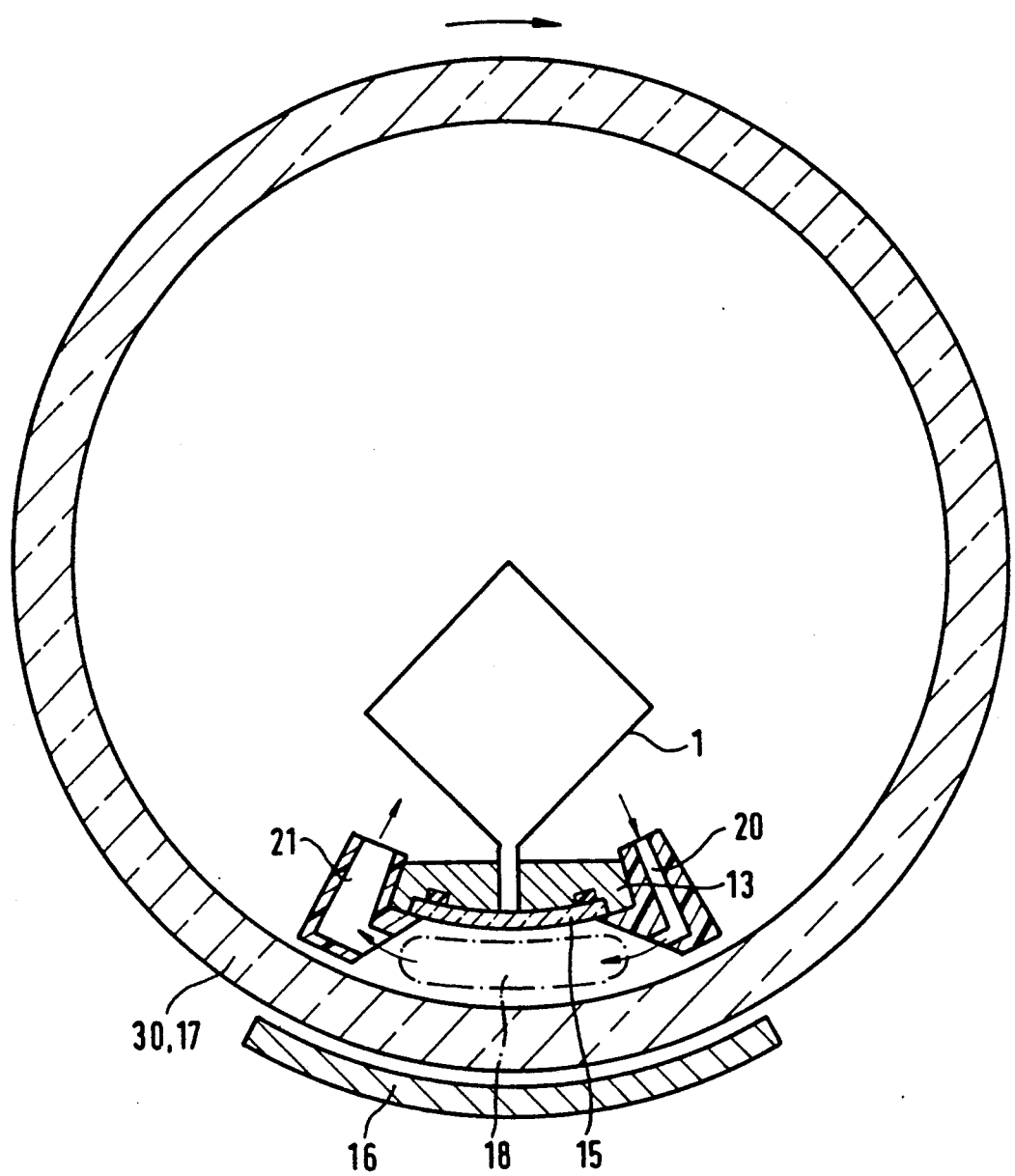
FIG. 8 is a diagrammatic representation of an embodiment of the device for coating the interior of glass tubes.

FIG. 8 shows another embodiment adapted to coat a substrate in the form of a glass tube 30, corresponding to substrate 17 of FIGS. 1 and 4, on the inside. The curvature of antenna base 13 and microwave window 15 are preferably matched to the radius of curvature of the glass tube. There are two possibilities for performing the coating operation, viz., waveguide 1 can be stationary and glass tube 30 can be rotated around waveguide 1, or glass tube 30 can be stationary and waveguide 1 can be rotated in tube 30.

In Tables 1 and 2 below, embodiments for dimensioning the waveguide or the process parameters for a $TiO_2$ coating are summarized.

TABLE 1

Embodiment for dimensioning the waveguide for 2.45 GHz microwave frequency:

| Variable | Value |
|---|---|
| a | 73 mm |
| s | 580 mm |
| $l_1$ | 605 mm |
| $l_2$ | 715 mm |
| $l_3$ | 825 mm |
| $\lambda_h$ | 220 mm |
| Antenna base width $b_2$ | 50 mm |

TABLE 2

Embodiment of process parameters for a $TiO_2$ coating:

| Variable | Value |
|---|---|
| Frequency | 2.45 GHz |
| Pulse energy | 2 × 6.0 kW |
| Pulse duration $t_d$ | 1 ms |

TABLE 2-continued

Embodiment of process parameters for a $TiO_2$ coating:

| Variable | Value |
|---|---|
| Pulse pause $t_p$ | 9 ms |
| Clock time $t_A$ | 0.1 ms |
| Average energy | 1.2 kW |
| Mass flow $O_2$ | 1.5 slm |
| Mass flow $TiCl_4$ | 15 sccm |
| Process pressure | 1 mbar |
| Substrate advance | 10 cm/min |

Without further elaboration, it is believed that one skilled in the art can, using the preceding description utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth uncorrected in degrees Celsius and unless otherwise indicated, all parts and percentages are by weight.

The entire disclosure of all applications, patents and publications, cited above and below, and of corresponding German application P 41 14 108.3, are hereby incorporated by reference.

EXAMPLE

EXAMPLE 1

Employing the device shown in FIGS. 1-3 and 8, a glass tube 17 of 600 mm inner diameter and 640 mm outer diameter and 605 mm length was coated on the inside on its full length with a 150 nm thick $TiO_2$ coating from a reaction gas of 1.5 slm $O_2$ and 15 sccm $TiCl_4$ flowing through the reaction space, by rotating the tube around the waveguide 1 at a rotation rate of 0.053 cycles per minute, whereby the substrate tube is heated by heating plate 16 to 90° C. The $TiO_2$ coating had a refractive index of 2.44 at 632 nm wavelength of light, which is close to the bulk value of the Anatase modification of bulk $TiO_2$ material, thus indicating high density and low porosity of the coating.

EXAMPLE 2

Employing the device shown in FIGS. 1-3, a quartz glass plate of width 605 mm is advanced with a velocity of 100 mm/min. in perpendicular direction of the x-direction of the waveguide 1, while a reaction gas flow of 1.5 slm $O_2$ and 15 sccm $CCl_2F_2$ is flowing through the reaction space. After this plasma treating, organic pollutions that had been on the quartz glass surface before the plasma treating, were removed and furthermore a 30 nm thick portion of the treated quartz glass surface was etched away, leaving a completely clean glass surface for further processing.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A process for treating or coating a substrate which comprises passing over the substrate a stream of a reaction gas, which is capable when excited of depositing a substance therefrom onto the substrate, flows over the surface to be treated or coated and exciting the reaction gas to a band-shaped plasma by microwaves generated in a waveguide, thereby treating the surface or depositing a coating thereon, by:

(a) exciting two standing waves of wavelengths $\lambda_{h1}$ and $\lambda_{h2}$ which are polarized perpendicular to one another, and shifting them relative to each other by one-quarter wavelength, in a waveguide means that is square in cross section; and (b) coupling the microwaves to the plasma by a lengthwise slit provided in one of the edges of the waveguide means.

2. A process according to claim 1, wherein the wavelengths $\lambda_{h1}$ and $\lambda_{h2}$ of the two standing waves are different.

3. A process according to claim 2, wherein the wavelengths $\lambda_{h1}$ and $\lambda_{h2}$ of the two standing waves differ from one another by less than 1 percent.

4. A process according to claim 1, wherein the microwaves are generated by two microwave generators which are periodically turned on for a time $t_d$ and off for a time $t_p$, whereby gas exchange during the treatment of the substrate is improved.

5. A process according to claim 4, wherein the microwave generators generate two waves of equal wavelength $\lambda_{h1} = \lambda_{h2} = \lambda_h$ and, during their turned-on period $t_d$, are alternately pulsed and wherein the clock time $t_A$ of the pulse is small compared to the reaction, precipitation and gas exchange times in the plasma.

6. A process according to claim 5, wherein turned-on time $t_d$ is between 0.5 and 2 ms and turned-off time $t_p$ is between 1 and 100 ms.

7. A process according to claim 5, wherein clock time is between 1 $\mu$sec and 100 $\mu$sec.

8. A process according to claim 4, wherein the wavelengths of the two waves differ by less than 1 percent; wherein their turned-on time $t_d$ is between 0.5 and 2 ms and their turned-off time $t_p$ is between 1 and 100 ms; wherein the block time $t_A$ of the pulse is between 1 $\mu$sec and 100 $\mu$sec; wherein the microwaves are generated at the ends of the waveguide; wherein microwave frequencies between 400 MHz and 10 GHz are used; and wherein, during the coating or treatment, either the substrate is moved perpendicular to the lengthwise slit or the lengthwise slit is moved relative to the substrate.

9. A process according to claim 1, wherein microwave frequencies between 400 MHz and 10 GHz are used.

10. A process according to claim 1, wherein, during the coating or treatment, either the substrate is moved perpendicular to the lengthwise slit or the lengthwise slit is moved relative to the substrate.

11. A process according to claim 1, wherein the substrate is either heated or cooled during the coating or treating thereof.

12. A process according to claim 1, wherein the microwaves are fed at the ends of the waveguide.

13. A device for treating or coating a surface of a substrate in which a stream of a reaction gas, which is capable when excited of depositing a substance therefrom onto the substrate, flows over the surface to be treated or coated and the reaction gas is excited to a band-shaped plasma by microwaves generated in a waveguide, which device comprises a reaction space for receiving a substrate to be treated or coated, a gas inlet connected to a source of the reaction gas for feeding reaction gas thereinto and reaction gas excitation means adjacent to the reaction space in which microwaves of wavelengths $\lambda_{h1}$ and $\lambda_{h2}$, respectively, are excited, whereby a surface of a substrate positioned in the stream of the reaction gas is treated or is coated with the substrate deposited, which reaction gas excitation means comprises:

(a) a waveguide with a first end closed by a first end wall and a second end closed by a second end wall;

(b) first and second microwave polarizers which are crossed and which are positioned in the waveguide at a distance $l_1 = \lambda_{h2}/2 \, (n + \frac{1}{4})$; and (c) first and second microwave feeds for feeding the microwaves and positioned, respectively, between the first end wall and the first polarizer, and between the second end wall and the second polarizer, so that each polarizer can be penetrated by the microwaves fed from the polarizer which is positioned closest thereto and cannot be penetrated by the microwaves fed from the feed which is positioned away therefrom; and wherein (i) the distance between an end wall and the polarizer positioned away therefrom in each case permits the formation of standing waves, and (ii) the waveguide has a square cross section and a lengthwise edge which, in the area between the polarizers, has a coupling slit therein of a length s and a width $b_1$ and which is closed relative to the reaction space and has a window therein formed of material through which the microwaves can penetrate.

14. A device according to claim 13, wherein either the end walls, the polarizers, or both, are mounted so as to be movable in the axial direction.

15. A device according to claim 13, wherein, to form a coupling channel along length d on the waveguide, boundary walls that extend essentially radially outward are positioned on the edge of the coupling slit.

16. A device according to claim 15, wherein length d is $0 \leq d \leq \lambda_h/4$.

17. A device according to claim 15, wherein the waveguide is placed on an antenna base that is conductively connected to the boundary walls.

18. A device according to claim 17, wherein the antenna base is metallic and has embedded therein a microwave window through which the microwaves can pass.

19. A device according to claim 18, wherein a gas inlet in gas communication with the reaction space is positioned on the side of the antenna base and ends in front of the microwave window.

20. A device according to claim 17, wherein the antenna base has a width which is a multiple of the width of the coupling slit.

21. A device according to claim 17, wherein either the substrate or the waveguide, antenna base and gas inlet are movable.

22. A device according to claim 21, arranged to coat the interior of a hollow tube while the tube is rotated, with the waveguide, antenna base and gas inlet being positioned on the inner wall of the tube.

23. A device according to claim 17, wherein a counterplate is positioned on the side of a substrate in the reaction space which faces away from the waveguide.

24. A device according to claim 23 comprising means to heat the counterplate.

25. A device according to claim 17, wherein either the end walls, the polarizers, or both, are mounted so as to be movable in the axial direction; wherein, to form a coupling channel along length d on the waveguide wherein d is $0 \leq d \leq \lambda_h/4$, boundary walls that extend essentially radially outward are positioned on the edge of the coupling slit, wherein the waveguide rests on an antenna base that is conductively connected to the boundary walls; wherein the antenna base is metallic and has embedded therein a microwave window through which the microwave can pass; wherein the antenna base has a width which is a multiple of the width of the coupling slit; wherein a gas inlet in gas communication with the reaction space is positioned on the side of the antenna base and ends in front of the microwave window; wherein either the substrate or the waveguide, antenna base and gas inlet are movable; and is arranged to coat the interior of a hollow tube while the tube is rotated with the waveguide, antenna base and gas inlet being positioned on the inner wall of the tube.

26. A device according to claim 25, wherein each feed is connected to a separate microwave generator and the generators are programmed to be turned on and off periodically and the wavelengths of the microwaves generated by the generators differ from each other by less than 0.01.

27. A device according to claim 25, wherein each feed is connected to a separate microwave generator which is programmed to be turned on and off periodically, the microwaves generated by the generators are of equal wavelength during the on periods, pulse sequences of 1 to 100 μsec, alternately so that when one of the generators emits power, the other is turned off and vice versa.

28. A device according to claim 13, wherein each feed is connected to a separate microwave generator and the generators are programmed to be turned on and off periodically and generate microwaves of a wavelength $\lambda_{h1}$ and $\lambda_{h2}$, respectively, in which $(\lambda_{h1} - \lambda_{h2})/\lambda_{h1}$ is less than 0.01.

29. A device according to claim 13, wherein each feed is connected to a separate microwave generator which is programmed to be turned on and off periodically and generate microwaves of equal wavelength and the microwave generators generate pulse sequences of clock time $t_A$ from 1 to 100 μsec, such that when one of the generators emits power, the other is turned off and vice versa.

30. In a plasma CVD process for applying a coating to a substrate, the improvement wherein the plasma is band-shaped and is generated by two excited standing waves which, relative to each other, are polarized perpendicularly and are shifted by one quarter wavelength.

* * * * *